United States Patent
Wang

(10) Patent No.: US 6,385,116 B2
(45) Date of Patent: May 7, 2002

(54) SEMICONDUCTOR INTEGRATED DEVICE

(75) Inventor: Jianqin Wang, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/797,271

(22) Filed: Mar. 1, 2001

(30) Foreign Application Priority Data

Mar. 1, 2000 (JP) ........................................ 2000-055301

(51) Int. Cl.$^7$ ............................. G11C 7/00; H02H 9/00
(52) U.S. Cl. .................................... 365/226; 361/56
(58) Field of Search .................. 365/226; 361/56, 361/58, 111

(56) References Cited

U.S. PATENT DOCUMENTS

| | | | |
|---|---|---|---|
| 5,144,519 A | * 9/1992 | Chang | 361/58 |
| 5,631,793 A | * 5/1997 | Ker et al. | 361/56 |
| 5,654,862 A | * 8/1997 | Worley et al. | 361/111 |
| 5,717,560 A | * 2/1998 | Doyle et al. | 361/56 |
| 5,818,086 A | * 10/1998 | Lin et al. | 257/355 |
| 5,940,258 A | * 8/1999 | Duvvury | 361/56 |
| 5,986,862 A | * 11/1999 | Kim | 361/56 |
| 5,990,723 A | * 11/1999 | Tanase | 327/313 |
| 6,144,542 A | * 11/2000 | Ker et al. | 361/111 |

FOREIGN PATENT DOCUMENTS

JP  11-74468  3/1999

\* cited by examiner

*Primary Examiner*—Vu A. Le
*Assistant Examiner*—Anh Phung
(74) *Attorney, Agent, or Firm*—Rosenman & Colin, LLP

(57) ABSTRACT

A semiconductor integrated device includes a functional circuit which has a plurality of signal terminals and an ESD protective circuit for protecting the functional circuit including a pair of protective diodes connected in a reverse direction between each of the signal terminals and a power source line or a ground line. The EDS protective circuit further has a bipolar transistor having a current path between the power source line and the ground line, and a capacitor connected between a collector and a base of the bipolar transistor. The protection against the ESD effectively functions when a surge is applied between the signal terminals because the current path for flowing the discharge current is formed.

5 Claims, 4 Drawing Sheets

SEMICONDUCTOR INTEGRATED DEVICE

BACKGROUND OF THE INVENTION (a) Field of the Invention

The present invention relates to a semiconductor integrated device, especially to the semiconductor integrated device including the function of effectively preventing the electrostatic destruction (hereinafter referred to as "ESD") of an integrated circuit by suitably configuring a protective circuit against static electricity.

(b) Description of the Related Art

The development of the fine processing technology promotes the higher integration and the higher speed of the semiconductor integrated circuit. The progress of the miniaturization reduces the resistance of the element to the static electricity. In the conventional semiconductor integrated circuit, protective diodes are connected in a reverse direction between a signal terminal and a power source line and between a signal terminal and a ground line to bypass the electrostatic energy to the power source line and the ground line, thereby protecting the internal circuit from the ESD. However, in the thus configured protective circuit, the sufficient protection cannot be achieved when either of the power source line and the ground line is open. Several semiconductor integrated circuits have been proposed to meet the sufficient protection of the circuit.

As shown in FIG. 1, a conventional semiconductor integrated circuit described in JP-A-11(1999)-74468 includes a PNP protective transistor Q11 and an NPN protective transistor Q12 connected to signal terminals for protecting a circuit 11 to be protected from static electricity. The emitter, the collector and the base of the protective transistor Q11 are connected to the signal terminal 15, a ground line 14 and a power source line 13, respectively. The emitter, the collector and the base of the protective transistor Q12 are connected to the signal terminal 15, the power source line 13 and the ground line 14, respectively. A pair of protective diodes D11 and D12 are parasitic diodes positioned between the bases and the emitters of the protective transistors Q11 and Q12, respectively.

When the power source line is closed and the signal terminal 15 receives a positive electric surge, or the ground line is closed and the signal terminal 15 receives a negative electric surge, the internal circuit is protected by the forward directed conduction of the base-emitter junction of the protective transistor. On the other hand, when the power source line is closed and the signal terminal 15 receives a negative electric surge, and when the ground line is closed and the signal terminal 15 receives a positive electric surge, the internal circuit is protected by the instantaneous transistor operation, or a surge charge is discharged to the power source line or the ground line by the larger current flowing in the collector when a smaller surge current flows in the base.

In accordance with the technique described in the above publication, the internal circuit can be effectively protected when one of the power source line and the ground line is open.

However, the ESD may take place in a variety of ranges from the manufacture to the application of the semiconductor integrated circuit, and the reasons of the occurrence thereof are not necessarily the positive or negative surge voltage applied to the signal terminals. In the protective circuit against the ESD (hereinafter referred to as "ESD protective circuit") described in the above publication, when a circuit to be protected is, for example, a common-emitter differential amplifier having a pair of differential transistors, and a power source line and a ground line both of which are open, at least one of the differential pair transistors is always subjected to reverse breakdown and destroyed by a surge voltage applied between the differential input and output.

Accordingly, the ESD protective circuit must be mounted such that the semiconductor integrated circuit in any conduction state is effectively protected if the surge voltage is applied between any two of the terminals.

SUMMARY OF THE INVENTION

In view of the foregoing, an object of the present invention is to provide a semiconductor integrated device which can be effectively protected from a charge between any two of terminals of the semiconductor integrated device having any conduction state.

Thus, the present invention provides a semiconductor integrated device including: a ground line; a power source line having a higher potential than that of the ground line; a functional circuit connected between the ground line and the power source line and having a plurality of signal terminals; and an ESD protective circuit for protecting the functional circuit, the ESD protective circuit including a pair of protective diodes each connected in a reverse direction between each of the signal terminals and one of the power source line and the ground line, a bipolar transistor having a current path connected between the power source line and the ground line, and a capacitor connected between a collector and a base of the bipolar transistor.

In accordance with the present invention, the protection against the ESD effectively functions regardless of the operation conditions and the circumstances of the connection of the terminals because the bipolar transistor and the capacitor form a current path for flowing discharge current.

The above and other objects, features and advantages of the present invention will be more apparent from the following description.

PREFERRED EMBODIMENTS OF THE INVENTION

Now, the present invention is more specifically described with reference to accompanying drawings.

Figure 1:
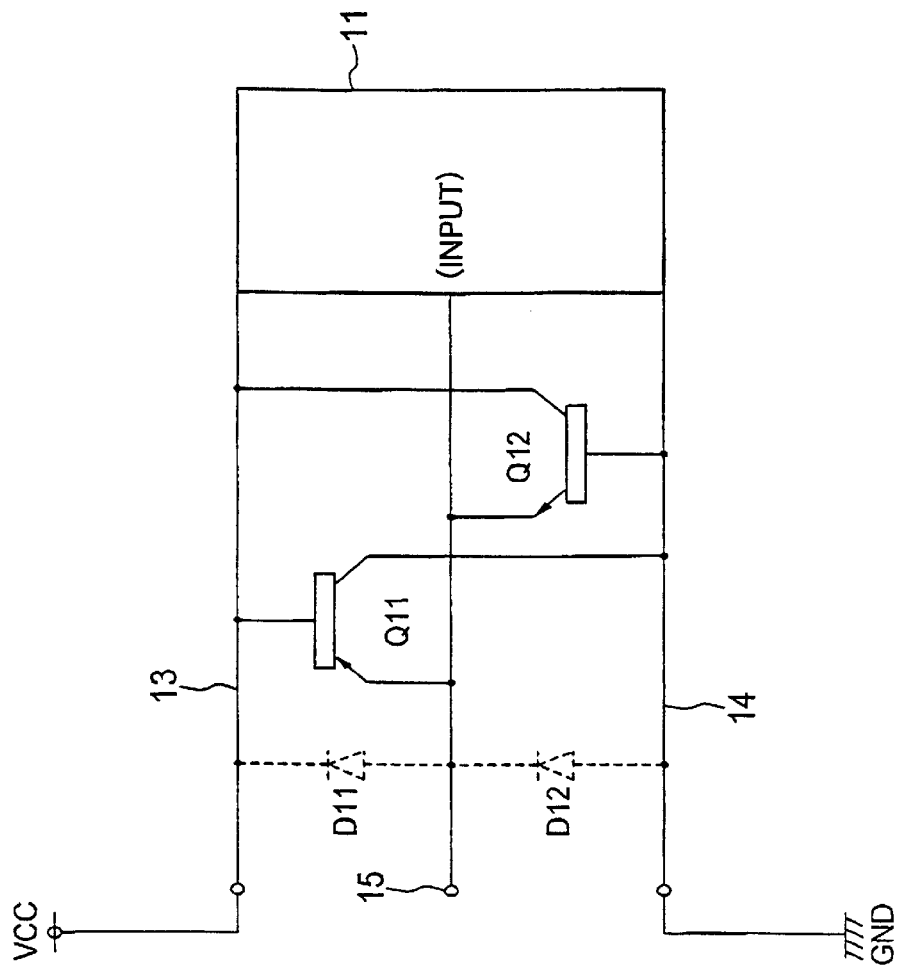
FIG. 1 is a circuit diagram of a conventional semiconductor integrated circuit.
Figure 2:
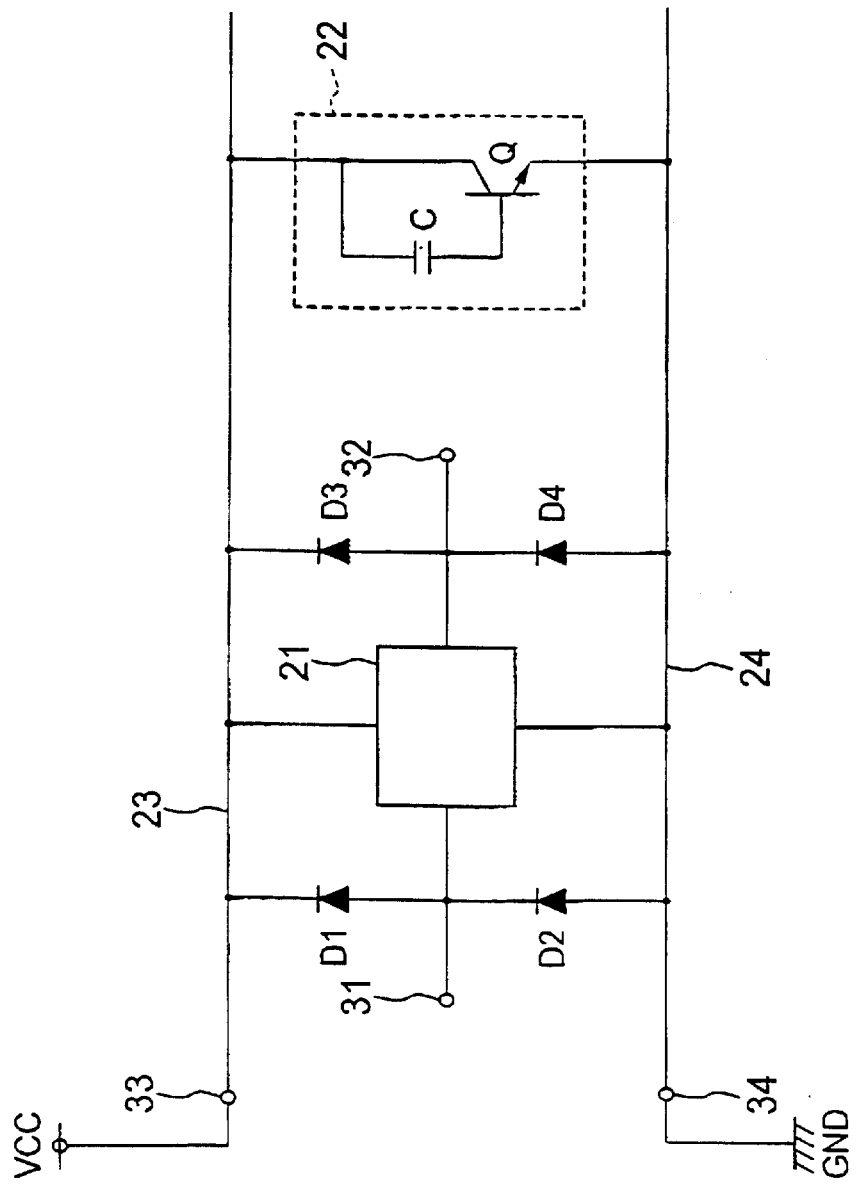
FIG. 2 is a circuit diagram showing a semiconductor integrated circuit in accordance with a first embodiment of the present invention.

As shown in FIG. 2, a semiconductor integrated circuit of a first embodiment includes a circuit 21 to be protected (hereinafter referred to as "functional circuit") from the ESD and having a plurality of signal terminals, protective diodes D1 to D4 connected between each of the signal terminals and a power source line or a ground line, and a charge pass circuit 22 for flowing discharge current between the power source line and the ground line.

The functional circuit 21 operates with a positive power source voltage with respect to the ground line. The anode of the protective diode D1 and the cathode of the protective diode D2 are connected to the signal terminal 31, and the anode of the protective diode D3 and the cathode of the protective diode D4 are connected to the signal terminal 32. Both of the cathodes of the protective diodes D1 and D3 are connected to a power source line 23, and both of the anodes of the protective diodes D2 and D4 are connected to a ground line 24.

The protective diodes D1 to D4 have excellent high frequency characteristics and a protective function against the ESD.

The charge pass circuit 22 includes an NPN discharge transistor "Q" and a discharge capacitor "C". The collector, the base and the emitter of the discharge transistor "Q" are connected to the power source line 23, the power source line 23 through intermediary of the discharge capacitor "C" and the ground line 24, respectively.

In the semiconductor integrated circuit of the present embodiment ordinarily operated, the potential between the power source line 23 and the ground line 24 is equal to a power source voltage VCC in a stationary state. Since the discharge capacitor "C" is not charged nor discharged in the ordinary state, base current does not flow in the discharge capacitor "C", thereby cutting off the collector and the emitter. At this stage, the power source line and the ground line of the functional circuit are connected to an external lower resistance power source, and if a surge voltage is applied between signal terminals 11 and 12, the protective diodes bypasses the surge energy to the power source line and the ground line and allows them to absorb the surge energy in accordance with a conventional protective mechanism, thereby effectively protecting the functional circuit.

Then, a protective mechanism for the above semiconductor integrated circuit which is in a non-ordinal operating condition will be described.

When the positive surge with respect to the power source line is applied to the signal terminal 11 or 12 or the negative surge with respect to the ground line is applied to the signal terminal 11 or 12, the protective diodes D1 to D4 conduct in a forward direction and the surge energy is absorbed.

When the negative surge with respect to the power source line is applied to the signal terminal, a positive charge flows, through intermediary of the power source line and the capacitor "C", into the base of the discharge transistor, thereby generating charging current in a forward direction in the base-emitter junction. At this stage, the larger current flows from the collector of the discharge transistor toward the ground line (such an operation of the discharge transistor will be referred to as "instantaneous operation") to increase the voltage between the signal terminal and the ground line, thereby conducting the protective diode D2 or D4 in a forward direction to discharge the current charges from the signal terminals. Similarly, when the negative surge is applied to the signal terminal 31 with respect to the signal terminal 32, the forward direction conduction of the protective diode D3, the instantaneous operation of the discharge transistor and the forward direction conduction of the protective diode D2 occur to discharge the positive charge from the signal terminal 31.

In accordance with the present embodiment, the protection of the semiconductor integrated circuit from the ESD can be attained by connecting the protective diodes to each of the signal terminals and at least one ESD circuit between the power source line 23 and the ground line 24 even if the surge voltage is applied to any two of the terminals because a discharge path exists.

Figure 3:
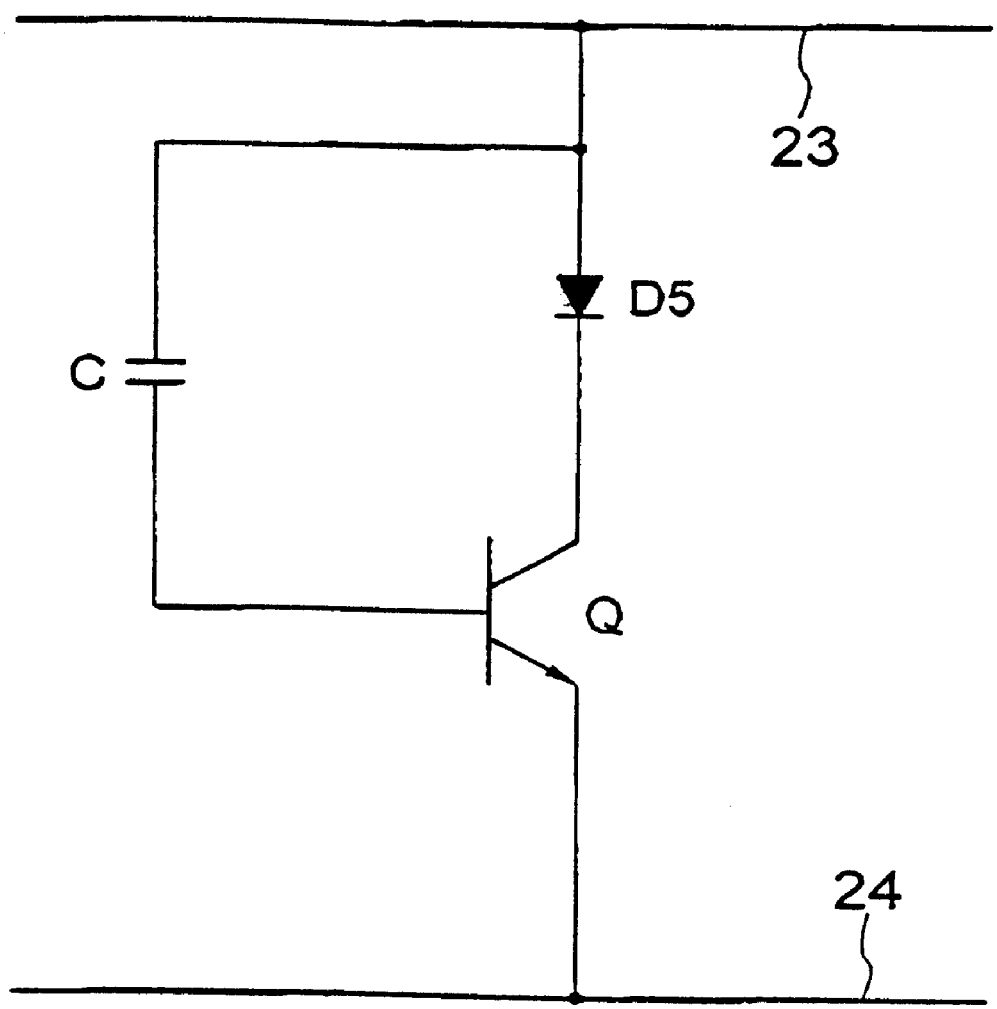
FIG. 3 is a circuit diagram showing a charge pass circuit of a semiconductor integrated circuit in accordance with a second embodiment.

In a second embodiment of the present invention shown in FIG. 3, a charge pass circuit 22A includes a discharge diode D5 of which a cathode and an anode are connected to the collector of the discharge transistor "Q" and the power source line 23, respectively.

The discharge diode D5 can reduce the forward voltage between the collector and the emitter of the transistor "Q", and the voltage can be arbitrary established by adjusting the characteristics and the number of the discharge diode D5. Thereby, since the semiconductor integrated circuit can be used at a rated power source voltage, the design standard of the withstand voltage between the collector and the emitter of the discharge transistor can be relaxed.

Figure 4:
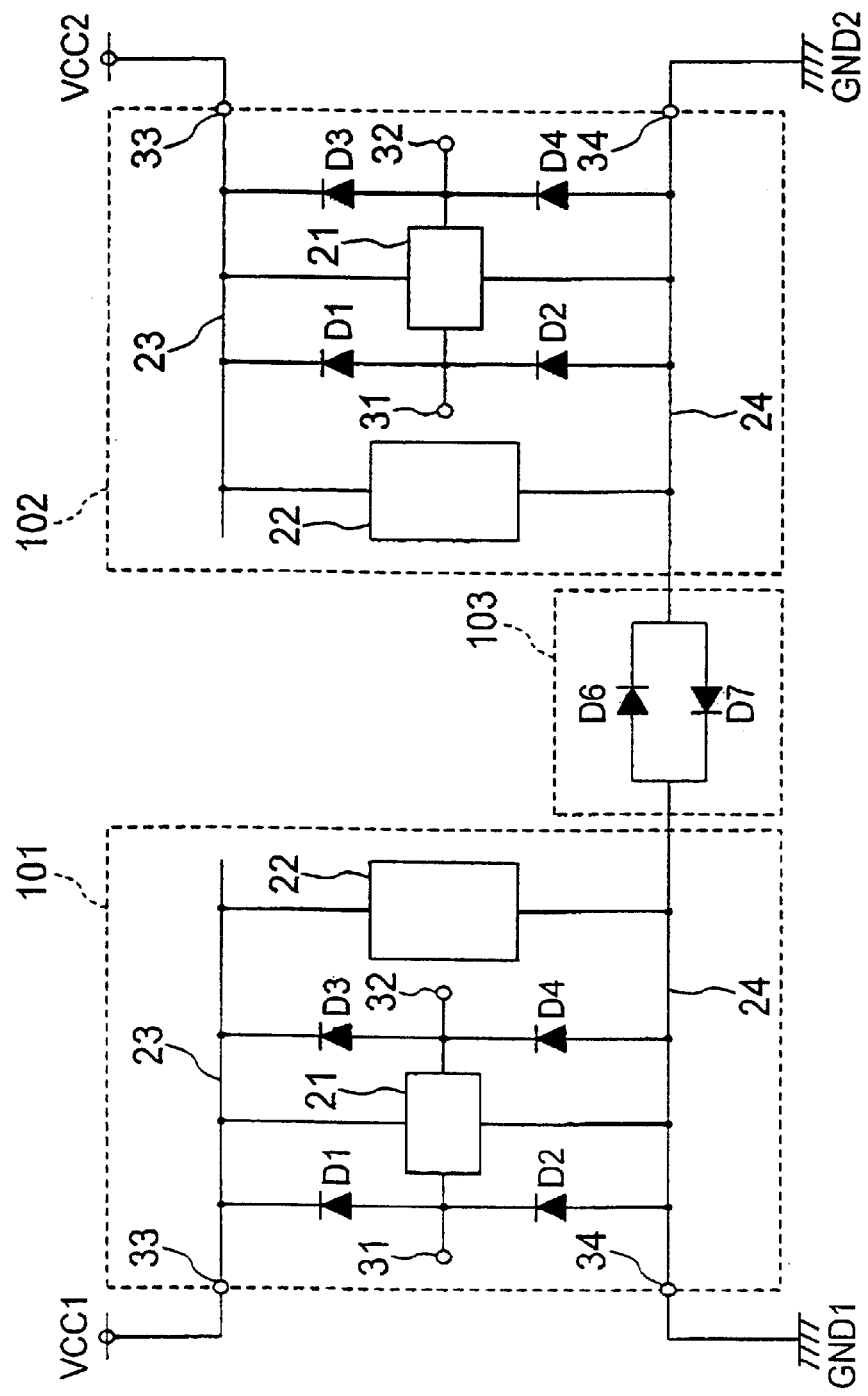
FIG. 4 is a circuit diagram showing a semiconductor integrated circuit in accordance with a second embodiment.

In a third embodiment of the present invention shown in FIG. 4, a semiconductor integrated circuit includes the two circuit blocks 101 and 102 each of which is similar to the circuit shown in FIG. 2, and a ground ring circuit 103 for flowing discharge current between the two circuit blocks 101 and 102. Each of the circuit blocks 101 and 102 is a high frequency circuit having a large scale multiple function, and a power source terminal 33 and a ground terminal 34 are connected for each of the circuit blocks 101 and 102 for highly isolating the circuit blocks.

The ground ring circuit 103 includes two intercircuit diodes D6 and D7, and each anode of the diodes is connected to each cathode of the other diode. The ground ring circuit 103 includes a node connected to the ground line 24 of the circuit block 101 and another node connected to the ground line 24 of the other circuit block 102.

In the semiconductor integrated circuit of the present embodiment ordinarily operated, the two ground lines have the same potential and are open, the isolation between the circuit blocks is not affected.

On the other hand, the semiconductor integrated circuit is operated under non-ordinal conditions, that is, all the power source lines and the ground lines are open, and the signal terminal 31 of the block 101 receives a positive surge with respect to the signal terminal 31 of the block 102, the forward conduction of the protective diode D1 of the circuit block 101, the instantaneous operation of the discharge transistor of the circuit block 101, the forward conduction of the protective diode D6 of the ground ring circuit 103 and the forward conduction of the protective diode D2 of the circuit block 102 occur to reach the positive charge to the signal terminal 31 of the circuit block 102, and the positive charge is discharged.

When a surge is applied between any two terminals of the different circuit blocks in addition to the above embodiment, an operation similar to that of the embodiment takes place to effectively protect the entire integrated circuit.

In the third embodiment, when the semiconductor integrated device is large-scaled by increasing the number of the circuit blocks and the surge is applied between the signal terminals, the protection against the ESD effectively functions because the current path for flowing the discharge current is formed.

Although the NPN transistor has been described as the bipolar transistor in the embodiments, a PNP transistor may be also used as the bipolar transistor.

Since the above embodiments are described only for examples, the present invention is not limited to the above embodiments and various modifications or alterations can be easily made therefrom by those skilled in the art without departing from the scope of the present invention.

What is claimed is:

1. A semiconductor integrated device comprising:

a ground line;

a power source line having a higher potential than that of the ground line;

a functional circuit connected between the ground line and the power source line and having a plurality of signal terminals; and an ESD protective circuit for protecting the functional circuit, the ESD protective circuit including a pair of protective diodes each connected in a reverse direction between each of the signal terminals and one of the power source lines and the ground line, a bipolar transistor having a current path connected between the power source line and the ground line, and a capacitor connected between a collector and a base of the bipolar transistor, said bipolar transistor and said capacitor forming a current path for flowing discharge current to protect said functional circuit when a surge is applied between said signal terminals.

2. The semiconductor integrated device as defined in claim 1 further comprising an additional diode connected between the capacitor and the collector of the bipolar transistor in a forward direction.

3. The semiconductor integrated device as defined in claim 1, wherein the bipolar transistor is an NPN transistor.

4. A semiconductor integrated device comprising:

a plurality of circuit blocks individually disposed; and each of the circuit blocks including:

a ground line;

a power source line having a higher potential than that of the ground line;

a functional circuit connected between the ground line and the power source and having a plurality of signal terminals; and an ESD protective circuit for protecting the functional circuit, the ESD protective circuit including a pair of protective diodes each connected in a reverse direction between each of the signal terminals and one of the power source line and the ground line, a bipolar transistor having a current path connected between the power source line and the ground line, and a capacitor connected between a collector and a base of the bipolar transistor, said bipolar transistor and said capacitor forming a current path for flowing discharge current to protect said functional circuit when a surge is applied between any two of said signal terminals.

5. The semiconductor integrated device as defined in claim 4 further comprising a pair of diodes connected between the ground lines of the adjacent circuit blocks in forward and reverse directions.

* * * * *